United States Patent [19]

Hayakawa et al.

[11] Patent Number: 5,739,186
[45] Date of Patent: Apr. 14, 1998

[54] EPOXY RESIN COMPOSITION FOR SEMICONDUCTOR ENCAPSULATION

[75] Inventors: Atsuhito Hayakawa; Yasuyuki Murata; Yoshinori Nakanishi; Norio Tohriiwa, all of Yokkaichi, Japan

[73] Assignee: Shell Oil Company, Houston, Tex.

[21] Appl. No.: 566,574

[22] Filed: Nov. 28, 1995

[51] Int. Cl.$^6$ .................. C08L 63/00; C08G 59/00
[52] U.S. Cl. .................. 523/443; 525/117; 525/524; 528/97; 528/98; 528/103
[58] Field of Search .................. 523/443; 525/117, 525/524; 528/103, 97, 98

[56] References Cited

U.S. PATENT DOCUMENTS

| | | | |
|---|---|---|---|
| 4,113,791 | 9/1978 | Smith et al. | 525/524 |
| 4,137,275 | 1/1979 | Smith et al. | 525/524 |
| 4,360,649 | 11/1982 | Kamio et al. | 525/484 |
| 4,701,481 | 10/1987 | Bogan et al. | 525/524 |
| 4,710,429 | 12/1987 | Bogan et al. | 525/523 |
| 4,798,761 | 1/1989 | Wykowski et al. | 428/272 |
| 5,006,611 | 4/1991 | Schmid et al. | 525/423 |
| 5,053,475 | 10/1991 | Tada et al. | 528/98 |
| 5,162,437 | 11/1992 | Hayashi et al. | 525/109 |
| 5,213,846 | 5/1993 | Tsuneta et al. | 427/386 |

FOREIGN PATENT DOCUMENTS

| | | |
|---|---|---|
| 0490230 A2 | 3/1991 | European Pat. Off. . |
| 0556429 A1 | 2/1992 | European Pat. Off. . |
| 55-124730-A | 9/1980 | Japan . |
| 6 0248-725 A | 5/1984 | Japan . |
| 05287219-A | 4/1992 | Japan . |
| 06135872-A | 5/1994 | Japan . |

OTHER PUBLICATIONS

Kobunshi Ronbunshu vol. 40, No. 5, by Dr. Hasegawa, (1983) p. 324.

European Search Report dated Feb. 20, 1996.

*Primary Examiner*—Randy Gulakowski
*Attorney, Agent, or Firm*—Dennis V. Carmen

[57] ABSTRACT

The invention relates to an epoxy resin composition for semiconductor encapsulation comprising at least an epoxy resin, hardener, inorganic filler, and accelerator, wherein said epoxy resin is one which is composed of about 20 to about 90 parts by weight of 4,4'-bisphenol F type epoxy resin and about 10 to about 80 parts by weight of either a polyhydric phenolic type epoxy resin which has slightly polar hydrocarbon groups (Z) lying between the phenyl nuclei, or a biphenol type epoxy resin.

7 Claims, No Drawings

EPOXY RESIN COMPOSITION FOR SEMICONDUCTOR ENCAPSULATION

FIELD OF THE INVENTION

The present invention relates to epoxy resin compositions for semiconductor encapsulation which are superior in fluidity and yield a cured resin superior in soldering crack resistance.

BACKGROUND OF THE INVENTION

Epoxy resin compositions are used in various applications such as bonding, casting, encapsulation, lamination, molding and coating owing to their good handling and curing characteristics. There is a large variety of epoxy resins to choose from, depending on the use and curing characteristics.

There have recently been a number of instances in which epoxy resins in common use have not achieved the performance required under conditions which are more severe than conditions which occurred before.

For example, the performance of epoxy resin compositions for semiconductor encapsulation should be greatly improved in view of the increased degree of integration, the enlarged semiconductor element, and the miniaturized and thinned package. Another impetus to the enhanced performance comes from the fact the surface mount technology for semiconductor devices is being put into practice. Since surface mounting is accomplished by dipping semiconductor devices directly into a solder bath, the package experiences a high stress because of the rapid expansion of absorbed moisture at a high temperature. This stress causes cracking of the encapsulant. Thus, if an epoxy resin composition for semiconductor encapsulation has to resist solder cracking satisfactorily, it should have good heat resistance (or high glass transition temperature), low moisture absorption, and low stress.

A common method of reducing moisture absorption and reducing stress (or lowering the coefficient of thermal expansion) is to fill the epoxy resin with a large amount of inorganic filler such as fused silica powder. This is highly effective in the improvement of solder crack resistance. However, a highly filled epoxy resin is poor in fluidity at the time of molding. Therefore, an epoxy resin for encapsulation should have a low melt viscosity. The generally used cresol novolak type epoxy resins do not have satisfactorily low moisture absorption and low melt viscosity.

Much has been studied on the reduction of moisture absorption by epoxy resins. A typical means is to introduce a slightly polar group (such as dicyclopentane skeleton and xylene skeleton) into the molecule. See Japanese Patent Laid-open Nos. 112813/1985 and 201922/1987. It is effective to some extent in reducing the moisture absorption but is not satisfactorily effective in reducing the melt viscosity. This prevents the high filling of an inorganic filler and hence prevents the further improvement of solder crack resistance.

The miniaturized and thinned packages require that epoxy resins for encapsulation have higher fluidity than before. Tetramethylbiphenyl-type epoxy resins are known to have a low melt viscosity and give a cured product having good solder crack resistance owing to its comparatively high heat resistance. See Japanese Patent Laid-open No. 47725/1986. However, it does not fully meet the recent severe requirements for low melt viscosity.

When it comes to low viscosity, bisphenol A type epoxy resins and bisphenol F type epoxy resins are satisfactory; however, they are liquid at normal temperature and hence they cannot be used as an encapsulant which has to be in the form of powder. In addition, they are also insufficient in low moisture absorption and heat resistance.

SUMMARY OF THE INVENTION

It is an object of the present invention to provide an epoxy resin composition for semiconductor encapsulation which has good fluidity and yields a cured product superior in solder crack resistance.

It has now been found that the object is achieved by employing an epoxy resin mixture of a specific bisphenol F type epoxy resin and either a specific epoxy resin having a slightly polar hydrocarbon group lying between the phenyl nuclei, or a specific bisphenol type epoxy resin.

Thus, the present invention relates to an epoxy resin composition for semiconductor encapsulation containing at least an epoxy resin, hardener, inorganic filler, and accelerator, wherein said epoxy resin is one which is composed mainly of 20–90 parts by weight of 4,4-bisphenol F type epoxy resin represented by the formula (I)

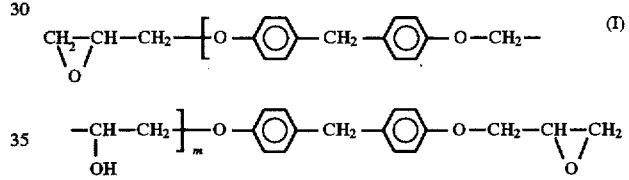

wherein m is a numeral of 0–0.5 on average, and 10–80 parts by weight of polyhydric phenolic type epoxy resin represented by the formula (II)

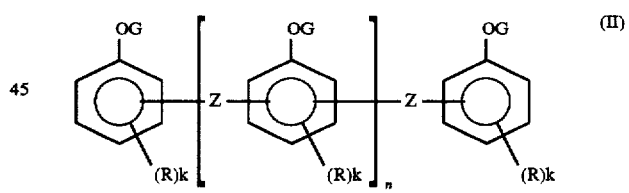

wherein slightly polar hydrocarbon groups are present between the phenyl nuclei, and wherein each R, which may be the same or different from one another, denotes a hydrogen atom, a $C_{1-10}$ alkyl group, a substituted or unsubstituted phenyl group, a substituted or unsubstituted aralkyl group, a $C_{1-10}$ alkoxyl group or a halogen atom, k denotes an integer of 0–4 and its values may be identical with or different from one another, G denotes a glycidyl group, Z denotes a $C_{5-10}$ divalent hydrocarbon group and Z's may be identical with or different from each other; and n is a numeral of 0–5 on average, or 10–80 parts by weight of biphenol type epoxy resin represented by the formula (III)

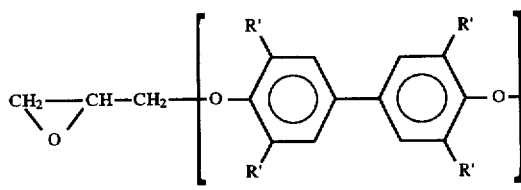 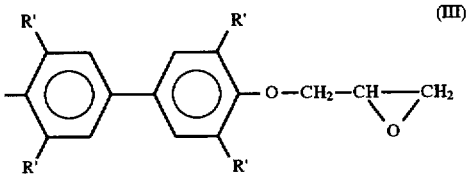

(III)

wherein each R', which may be the same or different from one another denotes a hydrogen atom, a $C_{1-10}$ alkyl group, a substituted or unsubstituted phenyl group, a substituted or unsubstituted aralkyl group, a $C_{1-10}$ alkoxyl group or halogen atom; and n' is a numeral of 0–0.05 on average.

DETAILED DESCRIPTION OF THE INVENTION

The bisphenol F type epoxy resin in common use is a mixture of 2,2'-isomer, 2,4'-isomer, and 4,4'-isomer. It is a viscous liquid at normal temperature because the former two isomers prevent the latter isomer from crystallizing. It yields a cured product with low heat resistance.

By contrast, the 4,4'-bisphenyl F type epoxy resin represented by the formula (I) above in the present invention is composed of 4,4'-isomer alone. Therefore, it is crystalline (solid) at normal temperature and has a low melt viscosity due to the fact that m in the formula (I) has an average value of 0–0.5.

In addition, it yields a cured product with comparatively good heat resistance. (It will be referred to as 4,4'-bisphenol F type epoxy resin (I) hereinafter.)

The polyhydric phenolic type epoxy resin represented by the formula (II) in the present invention has a slightly polar hydrocarbon group (—Z—) lying between the phenyl nuclei. Owing to this structure, it yields a cured product which is superior in low moisture absorption and has comparatively good heat resistance. (It will be referred to as polyhydric phenolic type epoxy resin (II) hereinafter.)

Further, the biphenol type epoxy resin represented by the formula (III) in the present invention is crystalline (solid) at normal temperature. Further, since n' in the formula (III) is a numeral of 0–0.5 on average, it yields a curable product with low viscosity and a cured product comparatively good heat resistance. (It will be referred to as biphenol type epoxy resin (III).

The present invention employs an epoxy resin composed mainly of 20–90 parts by weight, preferably 30–80 parts by weight, of 4,4'-bisphenol F type epoxy resin (I) and 10–80 parts by weight, preferably 20–70 parts by weight, of polyhydric phenolic type epoxy resin (II) or biphenol type epoxy resin (III). The epoxy resin composition of the present invention has good fluidity and yields a cured product superior equally in low moisture absorption, heat resistance, and solder crack resistance. If the amount of 4,4'-bisphenol F type epoxy resin (I) exceeds the above-specified limit, the epoxy resin composition has good fluidity but yields a cured product which is liable to moisture absorption or has insufficient heat resistance. If the amount of epoxy resin (II) or (III) exceeds the above-specified limit, the epoxy resin composition is poor in fluidity although it yields a cured product with low moisture absorption.

Therefore, the two components should be used in the specified ratio. 4,4'-bisphenol F type epoxy resin (I) can be produced by the condensation reaction of 4,4'-bisphenol F with epihalohydrin in the presence of alkali.

A typical embodiment of the production process is explained in detail in the following. First, 4,4'-bisphenol F is dissolved in epihalohydrin in an amount equivalent to 3–20 mol per mol of its phenolic hydroxyl group. To the resulting uniform solution is added with stirring an alkali metal hydroxide (in the form of solid or aqueous solution) in an amount of 1–2 mol per mol of the phenolic hydroxyl group. Reaction is carried out at atmospheric pressure or under reduced pressure. The reaction system should be kept at a prescribed temperature for azeotropic distillation, so that it is dehydrated by separating the condensate into water and oil, discarding water, and recycling oil. The alkali metal hydroxide should be added continuously or intermittently in small portions over 1–8 hours to avoid abrupt reactions. Usually, the reaction will take 1–10 hours to complete.

After the reaction is complete, the reaction product is freed of salt (as a solid by product) by filtration or water washing. Subsequently, epihalohydrin remaining unreacted is distilled way under reduced pressure. Thus there is obtained the desired 4,4'-bisphenol F type epoxy resin (I).

This reaction usually employs epichlorohydrin or epibromohydrin as the epihalohydrin and also employs NaOH or KOH as the alkali metal hydroxide.

Moreover, this reaction may employ a catalyst selected from quaternary ammonium salts (such as tetramethylammonium chloride and tetraethylammonium bromide), tertiary amines (such as benzylmethylamine and 2,4,6-(trisdimethylaminomethyl)phenol), imidazoles (such as 2-ethyl-4-methylimidazole and 2-phenylimidazole), phosphonium salts (such as ethyltriphenylphosphonium iodide), and phosphines (such as triphenylphosphine).

Moreover, this reaction may employ an inert organic solvent selected from alcohols (such as ethanol and isopropanol), ketones (such as acetone and methyl ethyl ketone), ethers (such as dioxane and ethyleneglycol dimethyl ether), and aprotic polar solvents (such as dimethylsulfoxide and dimethylformamide).

The thus obtained 4,4'-bisphenol F type epoxy resin may contain saponificable halogen in an excess amount. In such a case, it is possible to perform retreatment for further purification. Such treatment may consist of dissolving the crude epoxy resin again in an inert organic solvent (such as isopropanol), methyl ethyl ketone, methyl isobutyl ketone, toluene, xylene, dioxane, propyleneglycol monoethyl ether, and dimethylsulfoxide), adding to the solution alkali metal hydroxide (in the form of solid or aqueous solution), performing the ring-closing reaction again at about 30°–120° C. for 0.5–8 hours, removing excess alkali metal hydroxide and byproduct salt by water washing or the like, and distilling away the organic solvent under reduced pressure. In this way, it is possible to obtain purified 4,4'-bisphenol F type epoxy resin.

The polyhydric phenolic type epoxy resin (II) is produced by condensation reaction (in the presence of alkali) of a polyhydric phenolic resin with epihalohydrin, the former being represented by the formula (IV) below, with a slightly polar hydrocarbon group lying between the phenyl nuclei.

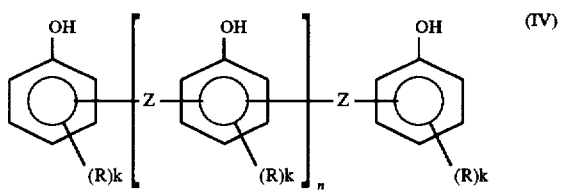
(IV)

wherein each R which may be the same or different from one another, denotes a hydrogen atom, a $C_{1-10}$ alkyl group, a substituted or unsubstituted phenyl group, a substituted or unsubstituted aralkyl group, a $C_{1-10}$ alkoxyl group or a halogen atom, k denotes an integer of 0–4 and its values may be identical with or different from one another, Z denotes a $C_{5-10}$ divalent hydrocarbon group and Z's may be identical with or different from each other and n is a numeral of 0–5 on average.

The polyhydric phenolic resin represented by the formula (IV) above may be produced in various ways. Common methods include addition condensation reaction of a phenol compound with a compound containing carbonyl groups, addition reaction of a phenol compound with a compound having unsaturated bonds, and condensation reaction of a phenol compound with an α-hydroxyalkylbenzene or an α-alkoxyalkylbenzene. The phenol compound may have the same substituent group and/or atom as R in the formula (II) above. The addition and/or condensation reaction gives an oligomer or a resin.

Examples of the phenol compound as a raw material include phenol, cresol, xylenol, ethylphenol, propylphenol, methoxyphenol, and bromophenol.

Examples of the compound containing carbonyl groups (which is used to oligomerize the phenol compound) include $C_{5-15}$ aldehydes and ketones, such as benzaldehyde, cyclohexane, acetophenone, and naphthaldehyde.

Examples of the compound having unsaturated bonds include divinylbenzene, diisopropenylbenzene, dicyclopentadiene, norbornene, and terpenes.

Examples of the α-hydroxyalkylbenzene or α-alkoxyalkylbenzene include α,α-dihydroxy-diisopropylbenzene, α,α-dimethoxyxylene, and α,α-dimethoxydiisopropylbenzene.

The oligomerization may be accomplished in the usual way in the presence of an acid catalyst at 20°–200° C. for 1–20 hours.

Of the thus obtained polyhydric phenolic resins represented by the formula (IV) above, dicyclopentadienephenol resin, terpene phenol resin, phenolaralkyl resin, and phenol-cyclohexanone resin are preferable because of their availability and curing characteristics.

The polyhydric phenolic type epoxy resin (II) used in the present invention is prepared by condensation reaction of one or more than one polyhydric phenolic resin represented by the formula (IV) above with epihalohydrin in the presence of alkali.

The procedure for this reaction is similar to that employed in the production of the 4,4'-bisphenol F type epoxy resin (I). Therefore, its detailed description is omitted.

Incidentally, the polyhydric phenolic type epoxy resin (II) is commercially available, and hence it is possible to practice the present invention using the commercial product.

The biphenol type epoxy resin (III) can be produced by condensation reaction of 4,4-biphenol with epihalohydrin in the presence of alkali.

The 4,4'-biphenol as a raw material of the biphenol type epoxy resin (III) includes, for example, 4,4'-biphenol, 3,3-dimethyl-4,4'-biphenol, 3,5-dimethyl-4,4'-biphenol, 3,3-dibutyl-4,4'-biphenol,3,5-dibutyl-4,4'- biphenol,3,3'-dibromo-4,4'-biphenol, 3,3',5,5'-tetramethyl-4,4'-biphenol, 3,3'-dimethyl-5,5'-dibutyl-4,4'-biphenol,3,3',5,5'-tetrabutyl-4,4'-biphenol, and 3,3',5,5'-tetrabromo-4,4'-biphenol.

The biphenol type epoxy resin (III) used in the present invention can be obtained by reacting one or more than one biphenol (mentioned above) with epihalohydrin in the same manner as in the production of the 4,4'-bisphenol F type epoxy resin.

The biphenol type epoxy resin (III) used in the present invention is commercially available under various trade names.

Thus, the present invention can be practiced by using such commercial products.

According to the present invention, the epoxy resin composition for semiconductor encapsulation contains an epoxy resin which is a mixture of the 4,4'-bisphenol F type epoxy resin (I) and the epoxy resin (II) or (III). This mixture may be prepared by mixing the two epoxy resins which have been prepared or purchased separately. Alternatively, the mixture may be prepared by mixing 4,4'-bisphenol F with the polyhydric phenolic resin of the formula (IV) or a biphenol and reacting the mixture with epihalohydrin.

The mixing ratio of the 4,4'-bisphenol F type epoxy resin (I) and the epoxy resin (II) or (III) should be 20–90 parts by weight, preferably 30–80 parts by weight, for former and 10–80 parts by weight, preferably 20–70 parts by weight, for the latter.

According to the present invention, the epoxy resin composition for semi conductor encapsulation contains an epoxy resin which is composed mainly of the 4,4'-bisphenol F type epoxy resin (I) and the epoxy resin (II) or (III) in the above-specified ratio. It should preferably be composed of the two epoxy resins (I) and (II), or (I) and (III) alone. However, it may contain other epoxy resins.

Examples of such additional epoxy resins include those epoxy resins prepared by condensation reaction of a phenol with epihalohydrin, epoxy resins prepared from an amine and epihalohydrin, and epoxy resins prepared from a carboxylic acid and epihalohydrin. The phenol include bisphenol A, bisphenol AD, hydroquinone, methylhydroquinone, dibutylhydroquinone, resorcin, methylresorcin, dihydroxy diphenyl ether, dihydroxynaphthalene, phenolnovolak resin, cresolnovolak resin, bisphenol A novolak resin, dicyclopentadiene phenolic resin, terpene phenolic resin, phenolaralkyl resin, naphtholnovolak resin, brominated bisphenol A, and brominated phenolnovolak resin. The phenol also includes polyhydric phenolic resins obtained by condensation reaction of a phenol with an aldehyde (such as hydroxybenzaldehyde, crotonaldehyde, and glyoxal).

The amines includes diaminophenylmethane, aminophenol, and xylenediamine. This carboxylic acid includes methylhexahydrophthalic acid and dimer acid.

The additional epoxy resins should be used in an amount less than 100 parts by weight, preferably 50 parts by weight, for 100 parts by weight of the total amount of the 4,4'-bisphenol F type epoxy resin (I) and the epoxy resins (II) or (III). When used in an excess amount, the additional epoxy resins have an adverse effect on the present invention.

According to the present invention, the epoxy resin composition for semiconductor encapsulation should be incorporated with a hardener as an essential ingredient. No restrictions are imposed on this hardener. Commonly used hardeners are satisfactory.

Examples of the hardener include phenols (such as bisphenol A, bisphenol F, bisphenol AD, hydroquinone, resorcin, methylresorcin, biphenol, tetramethyl-biphenol, dihydroxynaphthalene, dihydroxy diphenyl ether, phenolnovolak resin, cresolnovolak resin, bisphenol A novalak resin, cresolnovolak resin, bisphenol A novalak resin, dicyclopentadiene phenolic resin, terpene phenolic resin, phenolaralkyl resin, naphtholnovolak resin, brominated bisphenol A, and brominated phenolnovalak resin, phenolic resins (such as polyhydric phenolic resins obtained by condensation reaction of a phenol with an aldehyde such as hydroxybenzaldehyde, crotonaldehyde, and glyoxal), active ester compounds (which are obtained by esterifying (to form a benzoate of acetate) all or part of the phenolic hydroxyl group in the phenol or phenolic resin), acid anhydride (such as methyltetra hydrophthalic anhydride, and methyl nadic anhydride), and amines (such as diethylenetriamine, isophoro-nediamine, diaminophenylmethane, diaminophenylsulfone, and dicyandiamide).

Of these hardeners, phenols and phenolic resins and active ester compounds thereof are preferable from the standpoint of their curing characteristics.

According to the present invention, the epoxy resin composition for semiconductor encapsulation should contain a hardener in such an amount that the total amount of the reactive groups in the hardener is 0.5–2.0 mol, preferably 0.7–1.2 mol, per mol of the epoxy groups in all the epoxy resins.

According to the present invention, the epoxy resin composition for semiconductor encapsulation should be incorporated with an inorganic filler. Examples of the inorganic fillers include fused silica, crystalline silica, glass powder, alumina, and calcium carbonate, in the form of crushed powder or spherical powder. They may be used alone or in combination with one another. Of these examples, fused silica and crystalline silica are preferable. The amount of the inorganic filler should be 60–95 wt %, preferably 80–93 %, of the total amount of the epoxy resin composition.

According to the present invention, the epoxy resin composition for semiconductor encapsulation should be incorporated with an accelerator which is a compound to promote the reaction of the epoxy groups in the epoxy resin with the active groups in the hardener.

Examples of the accelerator include phosphine compounds (such as tributyl phosphine, triphenyl phosphine, tris(dimethoxyphenyl)phosphine, tris(hydroxypropyl) phosphine, and tris(cyanoethyl)phosphine), phosphonium tetraphenylborate, methyl-tributyl-phosphonium tetraphenylborate), imidazoles (such as 2-methylimidazole, 2-phenylimidazole, 2-ethyl-4-methyl-imidazole, 2-undecylimidazle, 1-cyanoethyl-2-methyl imidazole, 2,4-dicyano-6-[2-methylimidazolyl-(1)]-ethyl-S-triazine, and 2,4-dicyano-6[2-undecyl-imidazolyl-(1)]-ethyl-S-triazine), imidazolium salts (such as 1-cyanoethyl-2-undecylimidazolium trimellitate, 2-methylimidazolium isocyanurate, 2-ethyl-4-methyl-imidazolium tetraphenylborate, and 2-ethyl-1,4-dimethyl-imidazolium tetraphenylborate), amines (such as 2,4,6-tris (dimethylaminomethyl)phenol, benzyl-dimethylamine, tetramethylbutylguanizine, N-methylpiperazine, and 2-dimethylamino-1-pyrroline), ammonium salts (such as triethylammonium tetraphenyl-borate), diazabicyclo compounds (such as 1,5-diazabi-cyclo (5.4.0)-7-undecene, 1,5-diazabicyclo (4.3.0)-5-nonene, and 1,4, diazabicyclo (2.2.2)- octane), and diazabicyclo compounds in the form of tetraphenyl borate, phenol salt, phenol novalak salt, and 2-ethylhexanoic acid salt.

Preferable among these accelerators are phosphine compounds, imidazole compounds, and diazabicyclo compounds and salts thereof.

These accelerators may be used alone or in combination with one another in an amount of 0.1–7 wt %, preferably 1–5 wt %, of the epoxy resins.

According to the present invention, the epoxy resin composition for semiconductor encapsulation may be incorporated with coupling agents, plasticizers, pigments, etc. as required.

It may also be incorporated with a flame retardant such as antimony trioxide and phosphoric acid in a proper amount.

The epoxy resin composition for semiconductor encapsulation in the present invention can be advantageously used as an encapsulant for semiconductors because of its good fluidity and its ability to yield a cured producing good solder crack resistance.

The invention will be described in more detail with reference to the following Examples and Comparative Examples which demonstrate the production of epoxy resins and the use of the epoxy resin compositions.

(1) Production Example of Bisphenol F Type Epoxy Resin

A 3000 milliliter (ml) three-necked flask equipped with a thermometer, stirrer, and condenser was charged with 200 grams (g) of 4,4'-bisphenol F, 1295 g of epichlorohydrin, and 504 g of isopropyl alcohol. The reactants were heated to 35° C. for uniform dissolution. To the solution was added dropwise 190 g of 48.5 weight percent (wt %) aqueous solution of sodium hydroxide over 1 hour. In this period, the reaction system was gradually heated such that it reached 65° C. when the dropwise addition was completed. The reaction system as kept at 65° C. for 30 minutes for reaction. After the reaction was completed, the reaction product was washed with water to remove by-product salt and sodium hydroxide. The reaction product was freed of excess epichlorohydrin and isopropyl alcohol by distillation under reduced pressure. Thus there was obtained a crude epoxy resin.

The crude epoxy resin was dissolved in 400 g of methyl isobutyl ketone. To the solution was added 6 g of 48.5 wt % aqueous solution of sodium hydroxide. Reaction was carried out at 65° C. for 1 hour. After the reaction was completed, sodium primary phosphate was added to neutralize excess sodium hydroxide, and the resulting salt (as a by-product) was removed by water washing. The reaction product was completely freed of methyl isobutyl ketone by distillation under reduced pressure. Thus there was obtained the desired 4,4'-bisphenol F type epoxy resin.

This epoxy resin was a yellowish-white crystalline solid having an epoxy equivalent of 164 g/eq. and a melting point of 51° C., with the average value of m being 0.1 in the formula (I).

(a) Production Example of Polyhydric Phenolic Epoxy Resin having Interposed Hydrocarbon Groups The same procedure as in the production example (1) mentioned above was repeated to give an epoxy resin, except that the 4,4'-bisphenol F (200 g) was replaced by 360 g of dicyclopentadiene phenolic resin (DCP-5000 from Mitsui Toatsu Chemicals, Inc.).

The resulting epoxy resin was a yellowish red solid having an epoxy equivalent of 255 g/eq. and softening point of 62° C., as represented by the formula (II) in which R is a hydrogen atom, Z is a group represented by the formula below, k is 0, and n is 1.2.

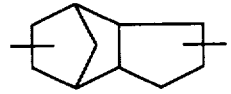

(b) Production Example of Polyhydric Phenolic Epoxy Resin having Interposed Hydrocarbon Groups The same procedure as in the production example (1) mentioned above was repeated to give an epoxy resin, except that the 4,4'-biphenol F (200 g) was replaced by 350 g of phenolaralkyl resin (Milex XL225LL from Mitsui Toatsu Chemicals, Inc.).

The resulting epoxy resin was a yellowish red solid having an epoxy equivalent of 252 g/eq. and a softening point of 64° C. as represented by the formula (II) in which R is a hydrogen atom, Z is a group represented by the formula below, k is 0 and n is 2.1.

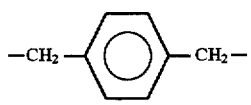

(c) Production Example of Polyhydric Phenolic Epoxy Resin having Interposed Hydrocarbon Groups The same procedure as in the production example (1) mentioned above was repeated to give an epoxy resin, except that the 4,4'-bisphenol F (200 g) was replaced by 330 g of terpenephenolic resin (YP-90 from Yasuhara Chemical Co., Ltd.).

The resulting epoxy resin was a yellowish red solid having an epoxy equivalent of 233 g/eq. and a softening point of 60° C., as represented by the formula (II) in which R is a hydrogen atom, Z is a group represented by the formula below, k is 0, and n is 0.1.

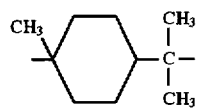

EXAMPLES 1 TO 5 AND COMPARATIVE EXAMPLES 1 TO 3

An epoxy resin composition was prepared from epoxy resins and auxiliaries shown below.

Epoxy resins: the epoxy resin obtained in the production example 1, the epoxy resin obtained in any of the production examples (a) to (c), cresol novolak type epoxy resin, and brominated epoxy resin.

Hardener: commercial phenol novolak resin (A) or commercial terpene phenol novolak resin (B)

Organic filler: commercial fused silica powder of crushed type (82 wt % of the entire composition in Examples 1 to 5 and Comparative Example 1; and 75 wt % of the entire composition in Comparative Examples 2 and 3)

Accelerator: triphenylphosphine

Flame retardant: antimony trioxide

Surface treating agent for inorganic filler: commercial epoxy silane

Mould release: carnauba wax

The resulting composition was kneaded at 70°–130° C. for 5 minutes using a mixing roll. The molten mixture was made into a shoot, which was subsequently crushed. Thus there was obtained a molding compound.

The molding compound was molded into a specimen by low pressure transfer molding, with the die temperature being 180° C. and the molding time being 180 seconds. The specimen was postcured at 180° C. for 8 hours. The molding material was also tested for spiral flow.

The postcured specimen and spiral flow test piece were tested for solder crack resistance, moisture absorption and glass transition point. The results are shown in Table 1. It is noted that the molding compounds in Examples 1 to 5 are superior to those in Comparative Examples 1 to 3 in both fluidity (spiral flow) and solder crack resistance.

TABLE 1

| Example No. (Comparative Example No.) | | 1 | 2 | 3 | 4 | 5 | (1) | (2) | (3) |
|---|---|---|---|---|---|---|---|---|---|
| Formulation of epoxy resin composition (parts by weight) | Epoxy resin (I) from production example (1) | 80 | 30 | 70 | 60 | 50 | 100 | — | — |
| | Epoxy resin (II) from production example (a), (b), or (c) | (a) 20 | (a) 70 | (a) 30 | (b) 20 | (c) 50 | — | (a) 100 | — |
| | Cresol novolak type epoxy resin[1] | — | — | — | 20 | — | — | — | 100 |
| | Brominated epoxy resin[2] | 10 | 10 | 10 | 10 | 10 | 10 | 10 | 10 |
| | Hardener (amount) | A[3] (61) | A[3] (50) | B[4] (100) | A[3] (59) | B[4] (95) | A[3] (65) | A[3] (43) | A[3] (53) |
| | Inorganic filler[5] | 838 | 788 | 1016 | 829 | 993 | 856 | 498 | 528 |
| | Tripenyl-phosphine | 1.0 | 1.0 | 1.0 | 1.0 | 1.0 | 1.0 | 1.0 | 1.0 |
| | Antimony trioxide | 10 | 10 | 10 | 10 | 10 | 10 | 10 | 10 |
| | Carnauba wax | 1 | 1 | 1 | 1 | 1 | 1 | 1 | 1 |
| | Epoxy silane[6] | 1 | 1 | 1 | 1 | 1 | 1 | 1 | 1 |
| Fluidity, spiral flow at 180° C., (cm) | | 88 | 80 | 85 | 84 | 84 | 96 | 71 | 61 |
| Properties of cured product | Solder crack resistance[7] | 0/16 | 0/16 | 0/16 | 0/16 | 0/16 | 8/16 | 10/16 | 15/16 |
| | Moisture absorption (%)[8] | 0.30 | 0.28 | 0.27 | 0.30 | 0.28 | 0.34 | 0.40 | 0.44 |
| | Glass transition point (°C.)[9] | 130 | 139 | 142 | 131 | 147 | 118 | 141 | 154 |

Notes to Table 1
[1] o-cresol novolaks type epoxy resin (Epikote 180H65, epoxy equivalent = 205, from Yuka Shell Epoxy K.K.)
[2] brominated bisphenol A type epoxy resin (Epikote 5050, epoxy equivalent = 385, bromine content = 49%, from Yuka Shell Epoxy K.K.).
[3] A: phenol novolak resin (hydroxyl equivalent = 103, softening point = 85° C., from Gun'ei Kagaku Co., Ltd.)
[4] B: terpene phenol novolak resin (Epikure MP402, hydroxyl equivalent = 175, softening point = 130° C., from Yuka Shell Epoxy K.K.)
[5] Fused silica powder of crushed type (RD-8, from Tatsumori Co., Ltd.)
[6] KBM-403, from Shin-Etsu Chemical Co., Ltd.
[7] 16 specimens (44-pin FPP) which had been allowed to absorb moisture at 85° C. and 85% RH for 300 hours were dipped in a solder bath at 260° C. for 10 seconds. The number of cracked specimens was counted.
[8] moisture absorption at 85° C. and 86% RH for 300 hours.
[9] obtained by TMA from the transition point on the thermal expansion curve.

It is apparent from Table 1 that the compositions in Examples are superior in fluidity to those in Comparative Examples and the cured products from the former are superior in moisture absorption, solder crack resistance, and heat resistance (in terms of glass transition point) to those from the latter.

(2) Production Example of Epoxy Resin

The same procedure as in the production example (1) mentioned above was repeated to give a mixture of 4,4'-bisphenol F type epoxy resin and biphenol type epoxy resin, except that the 4,4'-bisphenol F (200 g) was replaced by a mixture of 4,4'-bisphenol F (160 g) and 4,4'-biphenol (40 g).

The resulting epoxy resin was a yellowish white crystalline solid having an epoxy equivalent of 163 g/eq. It was a mixture of 80 wt % 4,4'-bisphenol F type epoxy resin represented by the formula (1) in which m has a value of 0.1 and 20 wt % biphenol type epoxy resin represented by the formula (III) in which n has a value of 0.1.

EXAMPLES 6 TO 10 AND COMPARATIVE EXAMPLES 4 TO 6

An epoxy resin composition was prepared from epoxy resins and auxiliaries as follows according to the formulation shown in Table 2.

Epoxy resins: the epoxy resin obtained in the production example (1), the epoxy resin obtained in the production example (2), commercial biphenol type epoxy resin (A or B) cresol novolak type epoxy resin, and brominated epoxy resin.

Hardener: commercial phenol novolak resin (C) or commercial terpene phenol novolak resin (D)

Inorganic filler: commercial fused silica powder of crushed type (82 wt % of the entire composition in Examples 6 to 10 and Comparative Examples 4 and 5; and 75 wt % of the entire composition in Comparative Example 6)

Accelerator: triphenylphosphine

Flame retardant: antimony trioxide

Surface treating agent for inorganic filler: commercial epoxy silane

Mould release: carnauba wax

The resulting composition was kneaded at 70°–130° C. for 5 minutes using a mixing roll. The molten mixture was made into a sheet, which was subsequently crushed. Thus there was obtained a moulding compound.

The moulding compound was moulded into a specimen by low-pressure transfer moulding, with the die temperature being 180° C. and the moulding time being 180 seconds. The specimen was postcured at 180° C. for 8 hours. The moulding material was also tested for spiral flow.

The post-cured specimen and spiral flow test piece were tested for solder crack resistance, moisture absorption, and glass transition point. The results are shown in Table 2. It is noted that the moulding compounds in Examples 6 to 10 are superior to those in Comparative Examples 4 to 6 in both fluidity (spiral flow) and solder crack resistance.

TABLE 2

| Example No. (Comparative Example No.) | | 6 | 7 | 8 | 9 | 10 | (4) | (5) | (6) |
|---|---|---|---|---|---|---|---|---|---|
| Formulation of epoxy resin composition (parts by weight) | Epoxy resin (I) from production example (1) | 80 | 30 | 70 | — | — | 100 | — | — |
| | Epoxy resin (II) from production example (2) | — | — | — | 80 | 100 | — | — | — |
| | Biphenol type epoxy resin (amount) | A[1] (20) | A[1] (70) | B[2] (30) | — | — | — | A[1] (100) | — |
| | Cresol novolak type epoxy resin[3] | — | — | — | 20 | — | — | — | 100 |
| | Brominated epoxy resin[4] | 10 | 10 | 10 | 10 | 10 | 10 | 10 | 10 |
| | Hardener (amount) | C[5] (64) | C[5] (59) | C[5] (65) | C[5] (63) | D[6] (112) | C[5] (65) | C[5] (56) | C[5] (53) |
| | Inorganic filler[7] | 852 | 829 | 856 | 847 | 1070 | 856 | 815 | 528 |
| | Tripenylphosphine | 1.0 | 1.0 | 1.0 | 1.0 | 1.0 | 1.0 | 1.0 | 1.0 |
| | Antimony trioxide | 10 | 10 | 10 | 10 | 10 | 10 | 10 | 10 |
| | Carnauba wax | 1 | 1 | 1 | 1 | 1 | 1 | 1 | 1 |
| | Epoxy silane[8] | 1 | 1 | 1 | 1 | 1 | 1 | 1 | 1 |
| Fluidity, spiral flow at 180° C., (cm) | | 88 | 81 | 87 | 86 | 87 | 96 | 64 | 61 |
| Properties of cured product | Solder crack resistance[9] | 0/16 | 0/16 | 0/16 | 0/16 | 0/16 | 8/16 | 2/16 | 15/16 |
| | Moisture absorption (%)[10] | 0.30 | 0.29 | 0.30 | 0.30 | 0.27 | 0.34 | 0.28 | 0.44 |
| | Glass transition point (°C.)[11] | 128 | 132 | 137 | 135 | 152 | 118 | 132 | 154 |

Notes to Table 2
[1] epoxy resin derived from tetramethylbiphenol (Epikote YX4000H, epoxy equivalent = 193, with the value of n in the formula (III) being 0.2, from Yuka Shell Epoxy K.K.)
[2] epoxy resin derived from biphenol and tetramethylbiphenol (Epikote YL6121H, epoxy equivalent = 173, with the value of n in the formula (III) being 0.1, from Yuka Shell Epoxy K.K.)
[3] o-cresol novolak type epoxy resin (Epikote 180H65, epoxy equivalent = 205, from Yuka Shell Epoxy K.K.)
[4] brominated bisphenol A type epoxy resin (Epikote 5050, epoxy equivalent = 385, bromine content = 49% from Yuka Shell Epoxy K.K.)
[5] phenol novolak resin (hydroxyl equivalent = 103, softening point = 85° C., from Gun'ei Kagaku Co., Ltd.)
[6] terpene phenol novolak resin (Epikure MP402, hydroxyl equivalent = 175, softening point = 130° C., from Yuka Shell Epoxy K.K.)
[7] Fused silica powder of crushed type (RD-8, from Tatsumori Co., Ltd.)
[8] KBM-403, from Shin Etsu Chemical Co., Ltd.
[9] 16 specimens (44-pin FPP) which had been allowed to absorb moisture at 85° C. and 85% RH for 300 hours were dipped in a solder bath at 260° C. for 10 seconds. The number of cracked specimens was counted.
[10] moisture absorption at 85° C. and 86% RH for 300 hours.
[11] obtained by TMA from the transition point on the thermal expansion curve.

What is claimed is:

1. An epoxy resin composition for semiconductor encapsulation comprising an epoxy resin, hardener, inorganic filler, and accelerator, wherein said epoxy resin comprises about 20 to about 90 parts by weight of a bisphenol F type epoxy resin solid at 25° C. wherein said bisphenol F type epoxy resin comprises 4,4'-bisphenol F and is free of 2,2'- and 2,4'-isomers, said 4,4'-bisphenol F type epoxy resin represented by the formula (I)

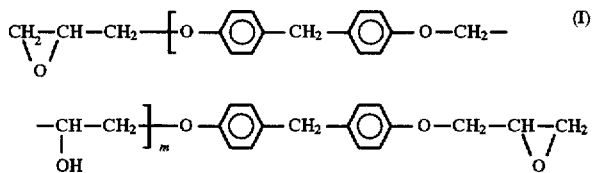

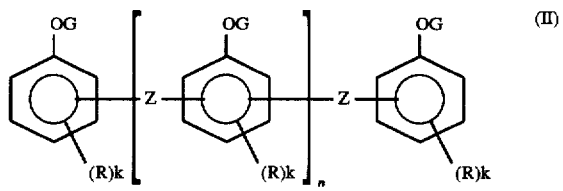

wherein m is a numeral of 0–0.5 on average, and 10 to about 80 parts by weight of a second epoxy resin selected from the group consisting of (a) a polyhydric phenolic type epoxy resin represented by the formula (II)

[structure II with OG groups, Z linkers, (R)k substituents, subscript n]

wherein slightly polar hydrocarbon groups are present between the phenyl nuclei, and wherein each R, which may be the same or different from one another, denotes a hydrogen atom, a $C_{1-10}$ alkyl group, a phenyl group, a aralkyl group, a $C_{1-10}$ alkoxyl group or a halogen atom, k denotes an integer of 0–4 and its values may be identical with or different from one another, G denotes a glycidyl group, Z denotes a $C_{5-10}$ divalent hydrocarbon group and Z's may be identical with Or different from each other, and n is a numeral of 0–5 on average, and (b) a biphenol type epoxy resin represented by the formula (III)

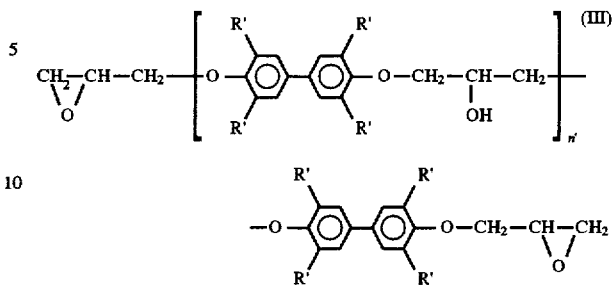

wherein each R', which may be the same or different from one another denotes a hydrogen atom, a $C_{1-10}$ alkyl group, a phenyl group, a aralkyl group, a $C_{1-10}$ alkoxyl group or halogen atom; and n' is a numeral of 0–0.05 on average.

2. The epoxy resin composition according to claim 1, comprising 30–80 parts by weight of the 4,4'-bisphenol F type epoxy resin and 20–70 parts by weight of said second epoxy resin.

3. The epoxy resin composition according to claim 1, in which in the general formula (II) R denotes a methyl group, k denotes 0 or 1, n is a numeral of 1–3 on average and Z is derived from cyclopentadiene, α,α'-dihydroxyxylene or terpene.

4. The epoxy resin composition according to claim 1, in which in the general formula (III) R' denotes a hydrogen atom or a methyl group.

5. The epoxy resin composition according to claim 1 in which the inorganic filler is fused silica or crystalline silicate.

6. The epoxy resin composition according to claim 1 in which the organic filler is present in an amount of about 60 to about 95 weight percent based on the total amount of the epoxy resin composition.

7. The epoxy resin composition according to claim 1 in which the hardener is present in such an amount that the total amount of the reactive groups in the hardener is 0.5–2.0 mole per mole of the epoxy groups in all the epoxy resins.

* * * * *